United States Patent [19]

Schaffer

[11] Patent Number: 5,055,796
[45] Date of Patent: Oct. 8, 1991

[54] CMOS OUTPUT STAGE

[75] Inventor: Gregory L. Schaffer, Cupertino, Calif.

[73] Assignee: Maxim Integrated Products, Sunnyvale, Calif.

[21] Appl. No.: 529,961

[22] Filed: May 25, 1990

[51] Int. Cl.$^5$ ............................................. H03F 3/26
[52] U.S. Cl. .................................... 330/263; 330/264
[58] Field of Search ............... 330/263, 264, 267, 277, 330/288, 296, 311

[56] References Cited

U.S. PATENT DOCUMENTS 4,446,444  5/1984  Patterson, III ...................... 330/264

Primary Examiner—Steven Mottola
Attorney, Agent, or Firm—Blakely, Sokoloff, Taylor & Zafman

[57] ABSTRACT

A CMOS output amplifier having a symmetrical output and a high ratio of output drive current to quiescent current. The amplifier uses first and second complementary devices connected in series between power supply connections with the output taken from the connection between the two devices. The input to the output stage is provided to the gate of the first device and to the gate of a third device of the same type as the second device, the source of the third device being maintained at a voltage which is independent of the input signal. The current through the third device is mirrored to the second device in a ratio of 1:N. Current sourcing and sinking capabilities of the output stage are an order of magnitude larger than the quiescent current requirements.

21 Claims, 2 Drawing Sheets

CMOS OUTPUT STAGE

BACKGROUND OF THE INVENTION

1. Field of the Invention.

The present invention relates to the field of CMOS integrated circuits.

2. Prior Art.

Integrated circuits such as operational amplifiers and the like are normally provided with an output stage for coupling to and driving whatever additional device or devices may be connected thereto in a particular application wherein the operational amplifier or other device is used. To be suitable for broad application, it is generally preferred to provide such output stages with various characteristics, some or all of which may be important in various applications. By way of example, in devices such as operational amplifiers, it is preferable to have a relatively large and symmetrical output swing, preferably rail to rail, though at least comprising a substantial portion of the supply voltage. It is also desirable to have the output relatively symmetrical, and able to both source and sink a substantial amount of current for driving loads having a significant capacitive component, yet dissipating relatively low quiescent power to minimize power consumption when not driving such loads in the same or different applications. Obviously various other characteristics such as stability, manufacturability, etc. are also important considerations.

The design of a suitable output stage in bi-polar technology is relatively easy, in that a push-pull NPN-PNP emitter follower stage may be used. If one attempts to apply the same concept to a CMOS output stage however, replacing NPN-PNP transistors with N Channel and P Channel FETs, the resulting output stage exhibits poor performance. In particular, the output stage will require about 3 volts of head room so that with a 5 volt supply, the output voltage swing is only approximately 2 volts, or approximately 40 percent of the supply. Another alternative is to use a vertical NPN emitter follower with a current source attached to its emitter. This reduces the head room to approximately a volt but the drive is very asymmetric, the output stage having a strong source current capability but a weak sink current capability.

Most commercial CMOS operational amplifiers use a third approach, namely a pair of output FETs, one being P-channel and the other N-channel. By having their drains connected together, the source of the P-channel device connected to the positive power supply line and the source of the N-channel device connected to the negative power supply line, such an output stage gives rail to rail swing at least under no load conditions. However the trick is in driving the gates of the two FETs appropriately.

A typical output stage in accordance with the prior art is shown in FIG. 1. Although there are several variations of the figure shown, all generally behave similarly. The output current $I_O$ is just $NI_A - NI_B$. It will be noted that P2 is N times larger than P1, N2 is K times larger than N1 and N4 is N times larger than N3.

$$I_O = N(I_A - I_B) = N(I_A - (2I - KI_A))$$

$$I_O = N[(1+K)I_A - 2I] \quad I_A \geq 0$$

Typically, $K = 1$

Then $I_O = 2N(I_A - I)$

In any case, maximum negative drive is $-2NI$ (when $I_A = 0$). When $I_O = 0$, $I_A = 2I/(1+K)$ and the current consumption of the stage is:

$$I_A + 2I + NI_A = (N+1)I_A + 2I = \left(\frac{N+1}{K+1}\right)(2I) + 2I = 2I\left(1 + \frac{N+1}{K+1}\right).$$

The ratio of maximum negative drive current to quiescent current is:

$$2NI \bigg/ \left[2I\left(1 + \frac{N+1}{K+1}\right)\right] = N \bigg/ \left(1 + \frac{N+1}{K+1}\right).$$

For typical values of $K=1$ and $N=20$, this ratio is $$20 \bigg/ \left(1 + \frac{21}{2}\right) = 1.74,$$

with the theoretical maximum being 2:1. Therefore to provide a lot of negative drive capability, the output stage must be operated at a high quiescent current.

BRIEF SUMMARY OF THE INVENTION

A CMOS output amplifier having a symmetrical output and a high ratio of output drive current to quiescent current. The amplifier uses first and second complementary devices connected in series between power supply connections with the output taken from the connection between the two devices. The input to the output stage is provided to the gate of the first device and to the gate of a third device of the same type as the second device, the source of the third device being maintained at a voltage which is independent of the input signal. The current through the third device is mirrored to the second device in a ratio of 1:N. Current sourcing and sinking capabilities of the output stage are an order of magnitude larger than the quiescent current requirements.

DETAILED DESCRIPTION OF THE INVENTION

Figure 2:
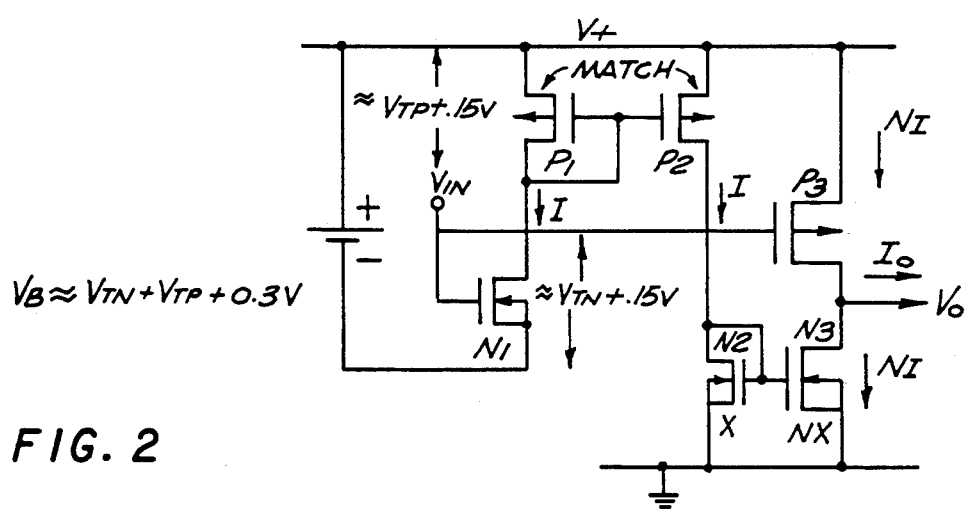
FIG. 2 is a circuit diagram for the basic circuit of the present invention.

Now referring to FIG. 2, a simplified schematic of the output stage of the present invention may be seen. In this circuit the P-channel devices are labeled P1, P2, and P3 respectively, with the N-channel devices similarly being labeled N1, N2, and N3 respectively. In the circuit shown, P-channel devices P1 and P2 are matched so as to have the same threshold and have equal areas, the two being connected so that the current in P1 is mirrored in P2. Similarly N2 and N3 are matched in the sense of having equal thresholds, though N-channel device N3 has an area N times the area of N-channel device N2. Also in the connections shown, devices N2 and N3 act as a current mirror, the current mirrored in device N3 being N times the current in device N2. At the nominal operating point $I_0$ is 0 and the voltage source $V_B$ is adjusted to approximately $V_{TN} + V_{TP} + 0.3$ volts, where $V_{TN}$ is the threshold voltage of the N-channel devices and $V_{TP}$ is the threshold of the P-channel devices. With $V_B$ set as stated, P3 and N3 will be kept on with their gates running at approximately 0.15 volts above their threshold voltages. As such, P3 and N3 have a drain current of NI, P2 and N2 a drain current of I, and P1 and N1 a drain current of I, making the total supply current $NI + 2I = (N+2)I$. $V_{IN}$ can typically swing plus or minus 0.5 volts which will raise the gate voltage of either P3 or N3 from 0.15 $V + V_T$ to 0.65 $V + V_T$, with the output current swing being symmetrical (assuming a symmetrical load).

For the circuit shown, the maximum symmetric drive is $(0.65/0.15)^2 \times NI = 18.78NI$, so that the drive to quiescent current ratio is typically $18.78NI/(N+2)I$. For a ten-to-one area ratio (N=10) between devices N3 and N2, this provides a maximum drive to quiescent current ratio of approximately 15.6, nine times better than the conventional circuit described in the prior art section hereof. For the circuit of FIG. 2 to operate as described however, a good voltage source for $V_B$ is required.

Figure 3:
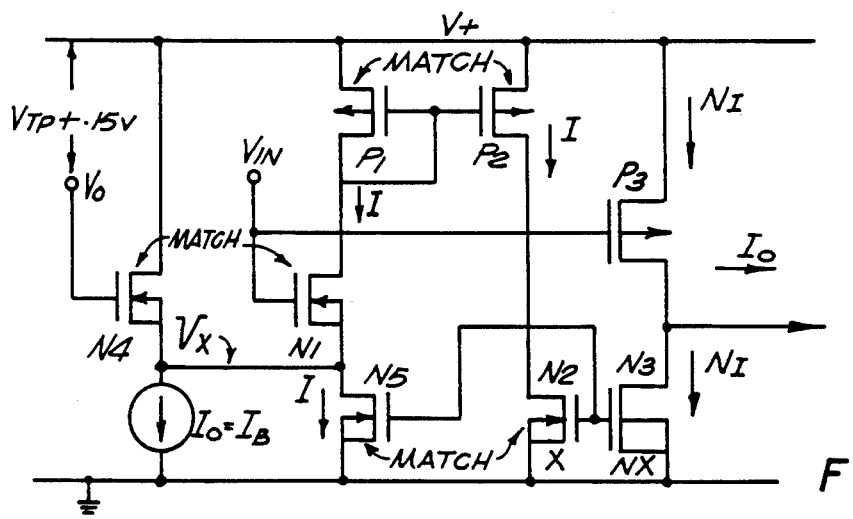
FIG. 3 is a circuit diagram similar to FIG. 2 showing additional circuit elements as may be used in a larger integrated circuit.

A complete circuit for the CMOS output stage of the present invention may be seen in FIG. 3. This figure is the same as FIG. 2, though has added thereto the current source Is and N-channel devices N4 and N5. N4's gate is biased by $V_B$ to $V_{TP} + 0.15$ volts below $V+$. $V_B$ and $V_{IN}$ are easily obtained from the P-channel current mirror of an N-channel input differential gain stage on the same chip or semiconductor substrate, thereby not requiring any special or additional circuitry for the generation thereof. In that regard, the CMOS output stage of the present invention of course is intended for realization in silicon substrate CMOS integrated circuits, rather than for realization in discreet form, and more particularly as the output stage of a larger circuit on the same chip. In the quiescent state, the current through N-channel device N4 and the current source $I_B$ is equal to I. Also the current through the series combination of devices P1, N1 and N5 is equal to I, as is the current through the series combination of P2 and N2, the current through the series combination of P3 and N3 in the quiescent state being NI. Thus the gate source voltage of device N4 in the quiescent state with current I through device N4 will be $V_{TN} + 0.15$ V, thereby setting the voltage $V_X$ at the desired bias voltage of $V_{TN} + V_{TP} + 0.3$ volts shown in FIG. 2.

The voltage $V_X$ shown in FIG. 3 will remain approximately constant even though many of the various currents will change with an input voltage $V_{IN}$. In particular, if the input voltage is decreased slightly, the current flow through P3 will increase accordingly and the current through N1 will decrease. This necessarily decreases the current through device P1, which decrease is mirrored to device P2, in turn reducing the current through device N2 in series therewith. This in turn reduces the current through device N3 by N times the reduction through device N2, and at the same time reduces the current through device N5 by an amount equal to the reduction in current through device N2. The net result is that while in a quiescent state devices P1, P2, N1, N5 and N2 all have a current I therethrough, a slight decrease in the input voltage will reduce the current through all five of the last named devices equally. Similarly, an increase in the input voltage $V_{IN}$ will increase the current in the foregoing five devices equally. Of particular importance is the fact that the current through device N5 will be equal to the current through devices N1 and P1 independent of the input voltage, even though the current through all three varies with input voltage. Accordingly the current in the line labeled $V_X$ in FIG. 3 will be substantially independent of the input voltage $V_{IN}$, so that the current through the N-channel device N4 will be and remain Is, the current of the current source attached thereto. Therefore, $V_X$ remains constant even though $V_{IN}$ varies.

Figure 1:
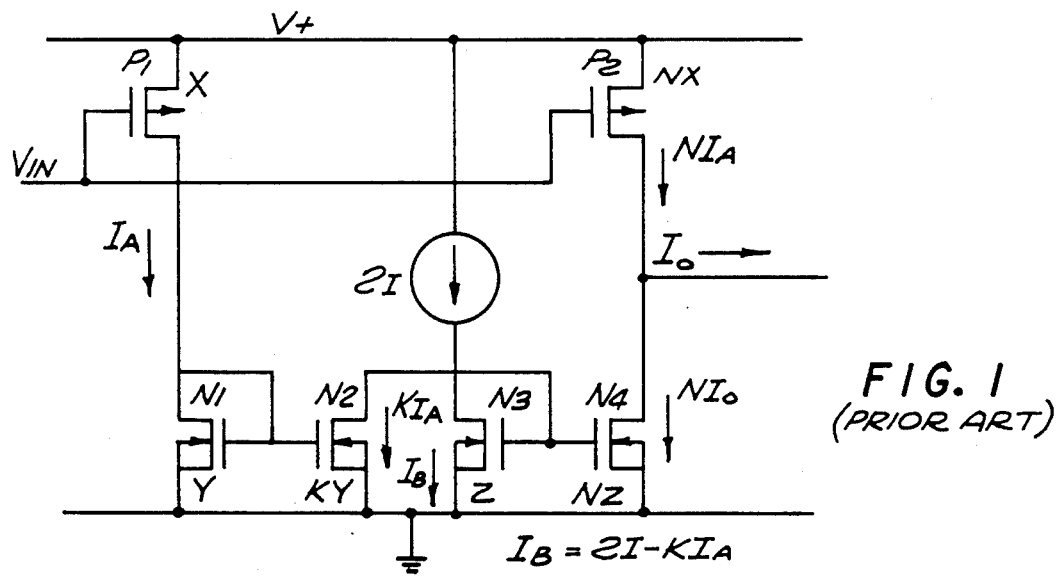
FIG. 1 is a circuit diagram for a typical prior art CMOS output stage.

The circuit shown in FIG. 3, like the circuit of FIG. 1, utilizes a current source, the design of which is not shown in detail in the figure. Such current sources, however, are very well known in the art and accordingly the details thereof need not be given herein. Further, in a typical application wherein the present invention is used as the output stage for a larger integrated circuit, such circuits frequently already include such a current source which may be mirrored in the proper ratio to provide the current source for the circuit of FIG. 3.

Figure 4:
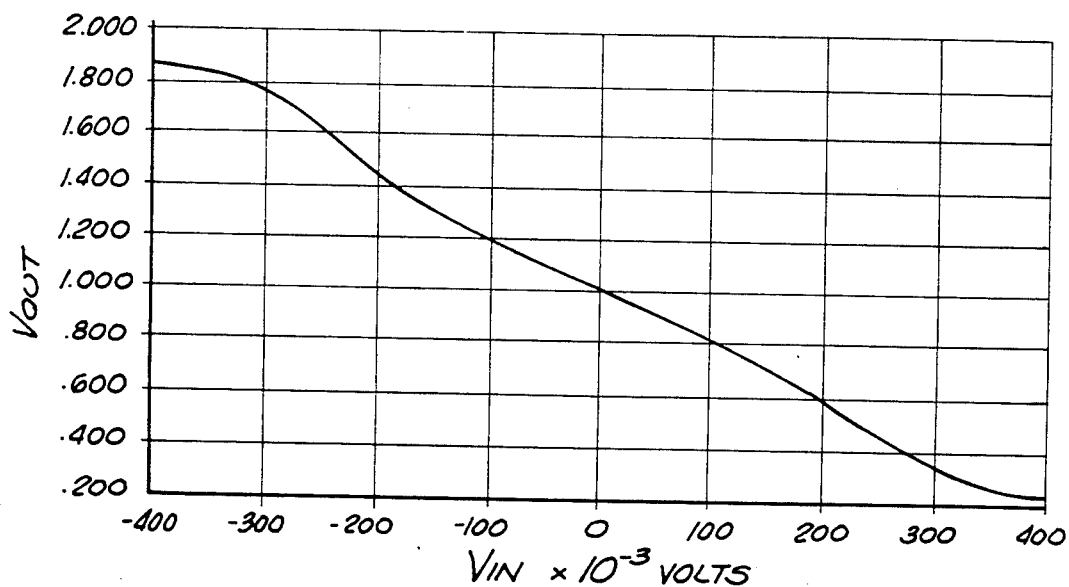
FIG. 4 is a curve showing a linearity of a CMOS output stage of the present invention when operating into a resistive load.

The advantage of the present invention is its ability to source and sink substantial load currents in a symmetrical manner without requiring a high quiescent current. As pointed out before, prior art output stages were limited to providing a negative output current (current sinking) of something less than twice the quiescent current for the output stage. In the present invention however, there is no such limit. In a computer simulation, a CMOS output stage in accordance with the present invention operating on a two volt supply into a 100 K load connected to the power showed good linearity in the range of outputs from 0.3 volts to 1.7 volts, as shown in FIG. 4. That Figure shows a curve of output versus input for the output stage operating in an open loop condition. Obviously in a typical operational amplifier application, the feedback used would very much further linearize the output, and in applications where the output, stage operates open loop to trigger or drive other devices connected thereto, the symmetry of the output will maintain good symmetry between the plus and minus driving conditions to such additional devices. While the linearity of the output as illustrated in FIG. 4 remains high over approximately seventy percent of the two volt supply range into a 100 K load, thereby providing a plus and minus 7 microamp output current, the quiescent current for the amplifier simulated is only 0.6 microamps, more than an order of magnitude lower. It is this combination of symmetrical output, high load current sourcing and sinking capability and high ratio of output current to quiescent current which characterizes the present invention.

Figure 5:
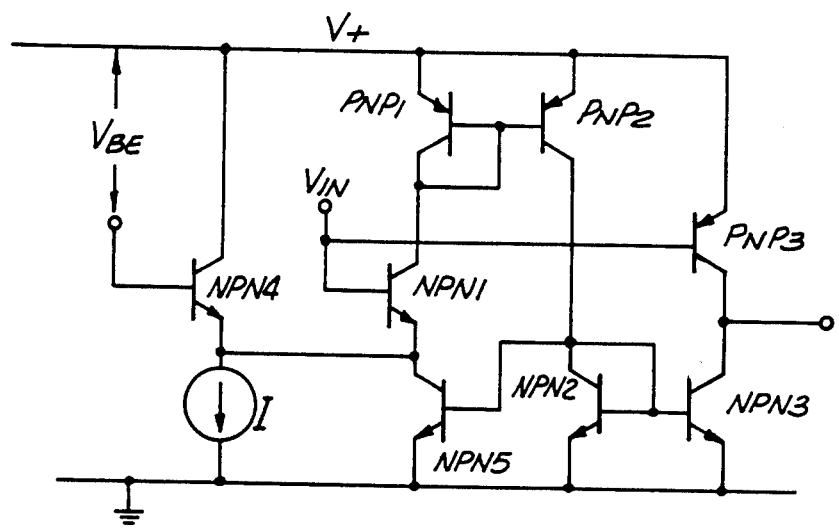
FIG. 5 is a circuit diagram similar to FIG. 3 as realized with junction transistors rather than field effect devices.

Now referring to FIG. 5, a circuit diagram for the circuit of FIG. 3 as realized with junction transistors may be seen. In this circuit each of the N channel devices of the circuit of FIG. 3 have been replaced by NPN transistors, and each of the P channel devices of the circuit of FIG. 3 have been replaced by PNP transistors. In this circuit the proper bias for the circuit is set by setting the voltage of the base of transistor NPN4 to one $V_{BE}$ below the upper power supply voltage. Generally such a voltage will otherwise be available in the integrated circuit in which the output stage is used, and accordingly the generation thereof is well known and need not be shown in the Figure. In general, the same approximate current ratios may be used as used in conjunction with FIG. 3, with the operation of the circuit of FIG. 5 being substantially identical to that of FIG. 3.

Thus, while the preferred embodiments of the invention have been disclosed and described herein, it will be understood by those skilled in the arts that varior's changes in form and detail may be made therein without departing from the spirit and scope thereof.

I claim:

1. A CMOS output stage comprising:
   first and second field effect devices of complementary types, each having a source, drain and gate, said drains of said first and second field effect devices being coupled together and to an output terminal and said sources of said first and second field effect devices each being coupled to a respective one of said first and second power supply terminals;
   input means coupled to said gate of said first field effect device for coupling an output stage input thereto;
   a third field effect device also having a source, drain and gate, said gate of said third field effect device being coupled to said input means and said drain thereof being coupled to one of said power supply terminals;
   means coupled to said source of said third field effect device for maintaining the voltage thereof substantially constant relative to and differing from the voltage of said first and second power supply terminals; and,
   means coupled to the drain of said third field effect device and the gate of said second field effect device for varying the gate source voltage of said second field effect device responsive to the variation of the gate source voltage of said third field effect device.

2. The CMOS output stage of claim 1 wherein said means coupled to said third field effect device and the gate of said second field effect device for varying the gate source voltage of said second field effect device responsive to the variation of the gate source voltage of said third field effect device is a means responsive to the current through said third field effect device for varying the gate source voltage of said second field effect device to provide a current therethrough approximately proportional to the current through said third field effect device.

3. The CMOS output stage of claim 2 wherein said means responsive to the current through said third field effect device for varying the gate source voltage of said second field effect device to provide a current therethrough approximately proportional to the current through said third field effect device comprises a first current mirror for providing a first mirror current proportional to the current through said third field effect device, and a second current mirror including said second field effect device for controlling the gate of said second field effect device so that the current therethrough is proportional to said first mirror current.

4. The CMOS output stage of claim 2 wherein said means responsive to the current through said third field effect device for varying the gate source voltage of said second field effect device to provide a current therethrough approximately proportional to the current through said third field effect device comprises fourth, fifth and sixth field effect devices, each having a source, drain and gate, the sources of said fourth and fifth field effect devices being coupled to one of said power supply terminals and the source of said sixth field effect device being coupled to the other power supply terminal, the drain of said sixth field effect device being coupled to the drain of said fifth field effect device and to the gates of said sixth and second field effect devices, and the drain of said fourth field effect device being coupled to the drain of said third field effect device and to the gates of said fourth and fifth field effect devices.

5. The CMOS output stage of claim 4 wherein said means coupled to said source of said third field effect device for maintaining the voltage thereof substantially constant relative to and differing from the voltage of said first and second power supply terminals comprises a seventh field effect device and a current source, said seventh field effect device also having a source, drain and gate, said drain of said seventh field effect device being coupled to one of said power supply terminals, said source of said seventh field effect device being coupled to the other power supply terminal through said current source and to the source of said third field effect device, whereby coupling the gate of said seventh field effect device to a substantially constant voltage will maintain the source voltage of said third field effect device substantially constant.

6. A method of operating a CMOS output stage comprising the steps of:
   (a) providing first and second field effect devices of complementary types, each having a source, drain and gate, the drains of the first and second field effect devices being coupled together and to an output terminal and the sources of the first and second field effect devices each being coupled to a respective one of first and second power supply terminals;
   (b) providing a third field effect device of the same type as the second field effect device, the third field effect device also having a source, drain and gate
   (c) coupling the source of the third field effect device to a voltage which is substantially constant and differing from that of said first and second power supply terminals
   (d) providing an input to the gates of the first and third field effect devices; and
   (e) controlling the gate source voltage of the second field effect device in accordance with the variation of the gate source voltage of the third field effect device.

7. A method of operating a CMOS output stage comprising the steps of:
   (a) providing first and second field effect devices of complementary types, each having a source, drain and gate, the drains of the first and second field effect devices being coupled together and to an output terminal and the sources of the first and second field effect devices each being coupled to a respective one of first and second power supply terminals;

(b) providing a third field effect device of the same type as the second field effect device, the third field effect device also having a source, drain and gate (c) coupling the source of the third field effect device to a voltage which is substantially constant and differing from that of said first and second power supply terminals (d) providing an input to the gates of the first and third field effect devices; and (e) mirroring the current in the third field effect device to the second field effect device.

8. The method of operating a CMOS output stage of claim wherein in step (e), the current in the third field effect device is mirrored to the second field effect device in a ratio of 1:N so that the current in the second field effect device is N times the current in the third field effect device, where N is substantially larger than unity.

9. An output stage comprising:

first and second transistors of complementary conductivity types, each having an emitter, base and collector, said collectors of said first and second transistors being coupled together and to an output terminal and said emitters of said first and second transistors each being coupled to a respective one of said first and second power supply terminals;

input means coupled to said base of said first transistor for coupling an output stage input thereto;

a third transistor also having an emitter, base and collector, said base of said third transistor being coupled to said input means and said collector thereof being coupled to one of said power supply terminals;

means coupled to said emitter of said third transistor for maintaining the voltage thereof substantially constant relative to and differing from the voltage of said first and second power supply terminals; and, means coupled to the collector of said third transistor and the base of said second transistor for varying the base emitter voltage of said second transistor responsive to the variation of the base emitter voltage of said third transistor.

10. The output stage of claim 9 wherein said means coupled to said third transistor and the base of said second transistor for varying the base emitter voltage of said second transistor responsive to the variation of the base emitter voltage of said third transistor is a means responsive to the current through said third transistor for varying the base emitter voltage of said second transistor to provide a current therethrough approximately proportional to the current through said third transistor.

11. The output stage of claim 10 wherein said means responsive to the current through said third transistor for varying the base emitter voltage of said second transistor to provide a current therethrough approximately proportional to the current through said third transistor comprises a first current mirror for providing a first mirror current proportional to the current through said third transistor, and a second current mirror including said second transistor for controlling the base of said second transistor so that the current therethrough is proportional to said first mirror current.

12. The output stage of claim 10 wherein said means responsive to the current through said third transistor for varying the base emitter voltage of said second transistor to provide a current therethrough approximately proportional to the current through said third transistor comprises fourth, fifth and sixth transistors, each having an emitter, base and collector, the emitters of said fourth and fifth transistors being coupled to one of said power supply terminals and the emitter of said sixth transistor being coupled to the other power supply terminal, the collector of said sixth transistor being coupled to the collector of said fifth transistor and to the bases of said sixth and second transistors, and the collector of said fourth transistor being coupled to the collector of said third transistor and to the bases of said fourth and fifth transistors.

13. The output stage of claim 12 wherein said means coupled to said emitter of said third transistor for maintaining the voltage thereof substantially constant relative to and differing from the voltage of said first and second power supply terminals comprises a seventh transistor and a current source, said seventh transistor also having an emitter, base and collector, said collector of said seventh transistor being coupled to one of said power supply terminals, said emitter of said seventh transistor being coupled to the other power supply terminal through said current source and to the emitter of said third transistor, whereby coupling the base of said seventh transistor to a substantially constant voltage will maintain the emitter voltage of said third transistor substantially constant.

14. A method of operating an output stage comprising the steps of:

(a) providing first and second transistor of complementary types, each having an emitter, base and collector, the collectors of the first and second transistors being coupled together and to an output terminal and the emitters of the first and second transistors being each coupled to a respective one of first and second power supply terminals;

(b) providing a third transistor of the same conductivity type as the second transistor, the third transistor also having an emitter, base and collector (c) coupling the emitter of the third transistor to a voltage which is substantially constant and differing from that of said first and second power supply terminals (d) providing an input to the bases of the first and third transistors; and (e) controlling the base emitter voltage of the second transistor in accordance with the variation of the base emitter voltage of the third transistor.

15. A method of operating an output stage comprising the steps of:

(a) providing first and second transistors of complementary conductivity types, each having an emitter, base and collector, the collectors of the first and second transistors being coupled together and to an output terminal and the emitters of the first and second transistors each being coupled to a respective one of first and second power supply terminals;

(b) providing a third transistor of the same conductivity type as the second transistor, the third transistor also having an emitter, base and collector (c) coupling the emitter of the third transistor to a voltage which is substantially constant and differing from that of said first and second power supply terminals (d) providing an input to the bases of the first and third transistors; and (e) mirroring the current in the third transistor to the second transistor.

16. The method of operating an output stage of claim 15 wherein in step (e), the current in the third transistor is mirrored to the second transistor in a ratio of 1:N so that the current in the second transistor is N times the current in the third transistor, where N is substantially larger than unity.

17. The CMOS output stage of claim 1 wherein the means coupled to said source of said third field effect device for maintaining the voltage thereof substantially constant relative to and differing from the voltage of said first and second power supply terminals maintains the voltage at a level differing from the voltage of the first power supply terminal by an amount approximately equal to the threshold voltage of a field effect device of one of the complementary types plus the threshold voltage of a field effect device of the other of the complementary types plus 0.3 volts.

18. The CMOS output stage of claim 5 wherein the substantially constant voltage of the gate of the seventh field effect device differs from the voltage of the first power supply terminal by an amount approximately equal to the threshold voltage of a field effect device of the type complementary to said third field effect device plus 0.15 volts.

19. The method of claim 6 wherein in step (c), the source of the third field effect device is coupled to a voltage which differs from the voltage of the first power supply terminal by an amount approximately equal to the threshold voltage of a field effect device of one of the complementary types plus the threshold voltage of a field effect device of the other of the complementary types plus 0.3 volts.

20. The method of claim 7 wherein in step (c), the source of the third field effect device is coupled to a voltage which differs from the voltage of the first power supply terminal by an amount approximately equal to the threshold voltage of a field effect device of one of the complementary types plus the threshold voltage of a field effect device of the other of the complementary types plus 0.3 volts.

21. The output stage of claim 13 wherein the substantially constant voltage of the base of the seventh transistor differs from the voltage of said first power supply terminal by approximately one VBE.

* * * * *

UNITED STATES PATENT AND TRADEMARK OFFICE
CERTIFICATE OF CORRECTION

PATENT NO. : 5,055,796
DATED : 10/8/91
INVENTOR(S) : Schaffer

It is certified that error appears in the above-identified patent and that said Letters Patent is hereby corrected as shown below:

| | | |
|---|---|---|
| col. 01, line 65 | after "$I_A - 2I$" delete ")" | insert --]-- |
| col. 03, line 38 | delete "Is" | insert --$I_B$-- |
| col. 04, line 18 | delete "Is" | insert --$I_B$-- |
| col. 05, line 14 | delete "varior's" | insert --various-- |
| col. 07, line 13 | after "claim" | insert --7-- |

Signed and Sealed this

Eighteenth Day of May, 1993

Attest:

MICHAEL K. KIRK

*Attesting Officer*  Acting Commissioner of Patents and Trademarks